(12) United States Patent
Yao et al.

(10) Patent No.: US 8,791,029 B2
(45) Date of Patent: Jul. 29, 2014

(54) STAMP HAVING NANOSCALE STRUCTURE AND APPLICATIONS THEREFORE IN LIGHT-EMITTING DEVICE

(75) Inventors: Chiu-Lin Yao, Hsinchu (TW); Ta-Cheng Hsu, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 190 days.

(21) Appl. No.: 12/222,548

(22) Filed: Aug. 12, 2008

(65) Prior Publication Data

US 2009/0045435 A1   Feb. 19, 2009

(30) Foreign Application Priority Data

Aug. 13, 2007   (TW) .............................. 96129925 A

(51) Int. Cl.
*H01L 21/461*   (2006.01)
(52) U.S. Cl.
USPC ........................................... 438/745; 438/46
(58) Field of Classification Search
USPC ............................................ 438/32, 46, 745
See application file for complete search history.

(56) References Cited

U.S. PATENT DOCUMENTS

| 7,915,622 | B2 | 3/2011 | Wang | |
|---|---|---|---|---|
| 2003/0219992 | A1 | 11/2003 | Schaper | |
| 2004/0169003 | A1 | 9/2004 | Lee et al. | |
| 2005/0224816 | A1* | 10/2005 | Kim et al. ........................ | 257/79 |
| 2006/0054905 | A1* | 3/2006 | Schwach et al. ................. | 257/89 |

FOREIGN PATENT DOCUMENTS

| CN | 1499289 A | 5/2004 |
|---|---|---|
| CN | 1871713 A | 11/2006 |
| CN | 101036237 A | 9/2007 |
| JP | 2005005679 | 1/2005 |
| JP | 2007150072 | 6/2007 |

* cited by examiner

*Primary Examiner* — Jack Chen
(74) *Attorney, Agent, or Firm* — Bacon & Thomas, PLLC

(57) ABSTRACT

A stamp having a nanoscale structure and a manufacturing method thereof are disclosed. The stamp includes a substrate, a buffer layer, and a nanoscale stamp layer. The method comprises forming a buffer layer on the substrate, and forming a stamp layer having a nanoscale structure on the buffer layer.

3 Claims, 9 Drawing Sheets

STAMP HAVING NANOSCALE STRUCTURE AND APPLICATIONS THEREFORE IN LIGHT-EMITTING DEVICE

BACKGROUND

1. Technical Field

The invention relates to a stamp having a nanoscale structure and its use in a light-emitting element.

2. Reference to Related Application

This application claims the right of priority based on TW application Ser. No. 96129925, filed on Aug. 13, 2007, entitled "STAMP HAVING NANOSCALE STRUCTURE AND APPLICATIONS THEREOF IN LIGHT-EMITTING DEVICE", and the contents of which are incorporated herein by reference.

3. Description of the Related Art

The light efficiency of solid-state lighting elements such as light-emitting diodes (LEDs) can be improved by increasing the internal efficiency and the light extraction, including the improvement of the efficiency of p-n junction in light-emitting layer, the use of different substrates and various epitaxial growth methods, etc. It can also be further improved by surface roughened processes. In an originally smooth surface, the light with the incident angle within 17 degree can be extracted, but it can be reflected by total reflection when the incident angle over 17 degree. The total reflection rate will be reduced and the light extraction will be increased if the surface was roughened. The most effective way is forming micro-structures on the surface of the chips or substrates to roughen interfaces or reduce the difference of interface refractive index to reduce the total reflection rate of the light extracted from the light-emitting diode chips. The roughened surface having nanoscale can be formed by the processes of the reactive ion etching (RIE) process or the inductively coupled plasma reactive ion etching (ICP-RIE) process, but the processes have poor uniformity and repetition. As the semiconductor industry develops and the processes innovate, a nanoscale process with high uniformity is no more out of reach. And now it is the research focus on the improvement of the light efficiency of light-emitting diodes in next century.

There are many different nano-technologies under development. In conventional semiconductor processes, the exposure light sources in photolithography processes are shifted from deep ultraviolet KrF 248 nm to ArF 193 nm, F2 157 nm, etc. The processes are belonged to optical lithography filed. For other processes does not belonged to the optical lithography filed such as E-beam direct write, SCALPEL, X-ray lithography, focused ion beam (FIB), etc., the processes have the abilities to limit linewidth to 100 nm, but the equipments costs are also multiply increased. Generally speaking, deep ultraviolet and SCALPEL have the abilities for mass production, but the equipments costs are very high. The E-beam direct write has extremely short wavelength (electron has extremely short wavelength), excellent DPI (can be less than 10 nm) and no need of mask, but it cannot be adopted in mass production like optical stepper can so its development is limited. The nano-imprint (NI) technology was presented by Professor S. Y. Chou in Princeton University in 1996. FIGS. 1A-1C show a process flow of nano-imprint technology. FIG. 1A shows an precise stamp 4 having a nanoscale pattern on the surface, and a substrate 6 coating with thermoplastic polymer material 5 such as PR is also provided. FIG. 1B shows the precise stamp imprinting process. By raising temperature to glass transition temperature, the thermoplastic polymer material 5 on the substrate 6 is imprinted by the precise stamp 4 and form patterns according to the pattern on the surface of the stamp. FIG. 1C shows the pattern forming process. After cooling, the thermoplastic polymer material 5 is solidified, the stamp is removed, the remained mask is cleaned by dry etching, and the pattern on the stamp is imprinted to the substrate 6. The process is similar with conventional hot embossing process. By using stamp having a nanoscale linewidth structure, imprint process of the nano-imprint (NI) technology can be proceeded in big scale and having the advantage in mass production to cover the disadvantage of low yield in E-beam direct write. The equipments cost is also far less than that of an optical stepper.

The nano-imprint (NI) technology can be defined as follows: imprint pattern from stamp having a nanoscale structures to specific materials in various way such as hot press, UV, light exposure to reach the goal of imprinting in big scale or mass production. Basing on the reason of developing this technology, it is obvious that the advantage of this technology is reaching a linewidth as small as in nanoscale, imprinting with high speed, and has advantages in mass production comparing to the present nano molding technologies. Therefore the point of this technology is forming stamps accurately. Generally, the stamps can be formed by electron-bean microlithography direct write process or ion optical lithography process and so on. But the cost is high because of time-consuming. Besides, most stamps have step-profile with rise and fall pattern. Although it can be used to control the light extraction of light-emitting diodes by, for example, forming photonic crystals, but the improvement in light extraction efficiency of light-emitting diodes is limited because most of the lights are extracted from the side wall of light-emitting diodes.

SUMMARY

A stamp having a nanoscale structure is disclosed. The stamp includes a substrate which can be aluminum oxide or silicon. A buffer layer formed on the substrate wherein the buffer layer can be gallium nitride series materials, metal or dielectric material. A stamp layer, which can be un-doped gallium nitride or n-type gallium nitrie, having a nanoscale structure is formed on the buffer layer.

The present invention also provides a method of forming a stamp having a nanoscale structure. Because the etching solution has the inclination for the lattice direction of materials, it is used to etch a specific stamp having a nanoscale structures or pattern. By using the stamp in the nano-imprint (NI) technology, the nanoscale pattern are imprinted to front side or back side of the LED chips in every range of the wavelength, and then are imprinted to semiconductors to roughen the surface by etching processes to increase the light extraction efficiency of the LEDs.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1A:
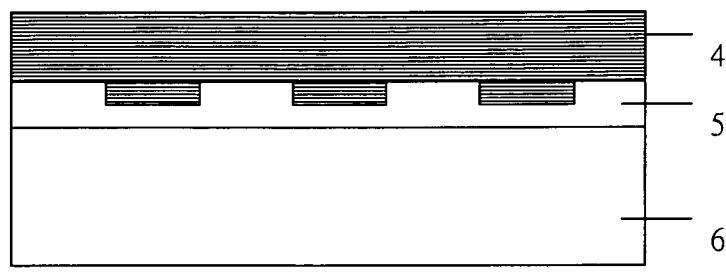
FIGS. 1A-1C show a process flow of the nano-imprint technology.

The invention relates to a stamp having a nanoscale structure and its manufacturing methods thereof. Reference is made in detail to the preferred embodiments of the present invention, examples of which are illustrated in the accompanying drawings. Wherever possible, the same reference numbers are used in the drawings and the description to refer to the same or like parts.

Figure 2:
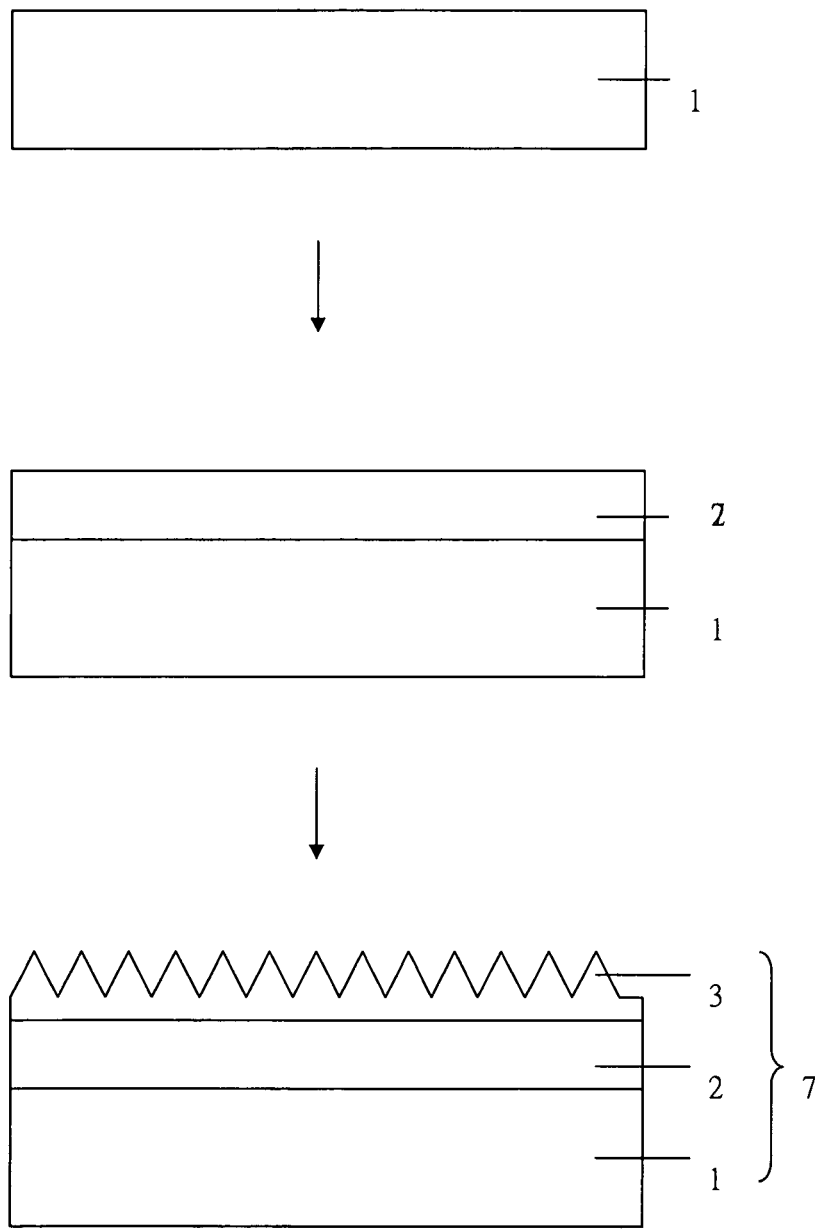
FIG. 2 shows a flow chart of forming a stamp having a nanoscale structure in accordance with a first embodiment of the present invention.

Embodiment 1:

Referring to FIG. 2, a buffer layer 2 such as un-doped gallium nitride is epitaxially grown on a substrate 1 like aluminum oxide (sapphire) by metal-organic chemical vapor deposition (MOCVD) process. A stamp layer 3 such as un-doped gallium nitride or n-doped gallium nitride is formed with a thickness of more than 5000 Å. By adjusting parameters of metal-organic chemical vapor deposition process, the surface of the stamp layer can be patterned in serrated shape or triangle shape sized from 10 nm to 1000 nm and with a period in a range of 20 nm to 2000 nm to form a stamp having a nanoscale structure 7.

Figure 3:
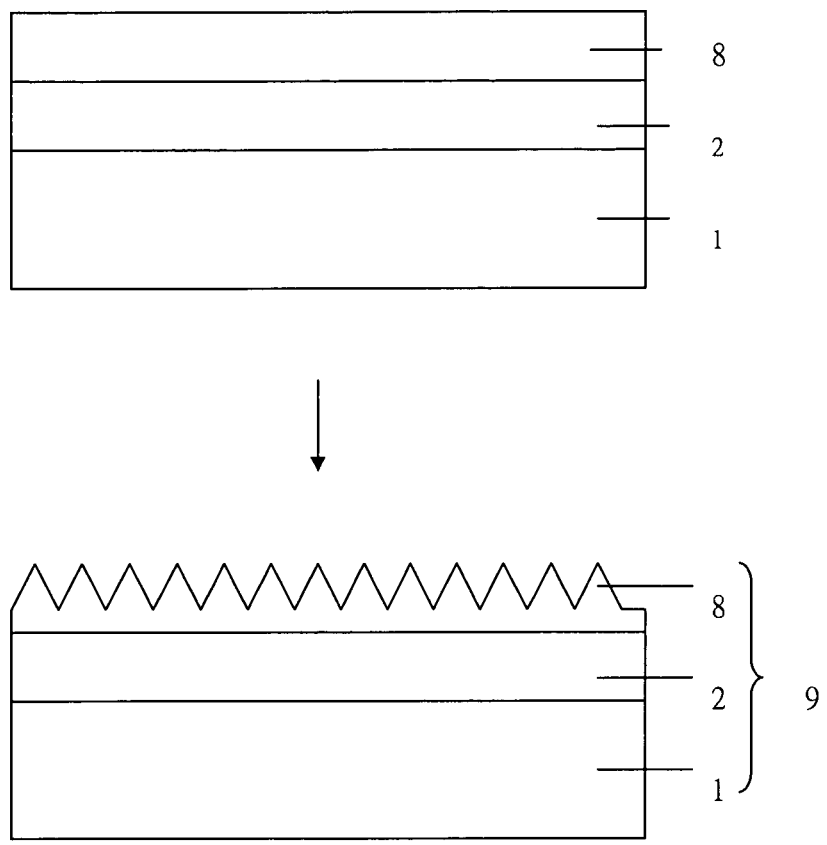
FIG. 3 shows a flow chart of forming a stamp having a nanoscale structure in accordance with a second embodiment of the present invention.

Embodiment 2:

Referring to FIG. 3, a buffer layer 2 such as un-doped gallium nitride is epitaxially grown on a substrate 1 like aluminum oxide (sapphire) by metal-organic chemical vapor deposition (MOCVD) process. A stamp layer 8 such as un-doped gallium nitride or n-doped gallium nitride is formed with a thickness of more than 5000 Å. The stamp layer is etched by potassium hydroxide (KOH) for 3 minutes. The surface of the stamp layer can be patterned in serrated shape or triangle shape sized from 10 nm to 1000 nm and with a period in a range of 20 nm to 2000 nm to form a stamp having a nanoscale structure 9.

Figure 4A:
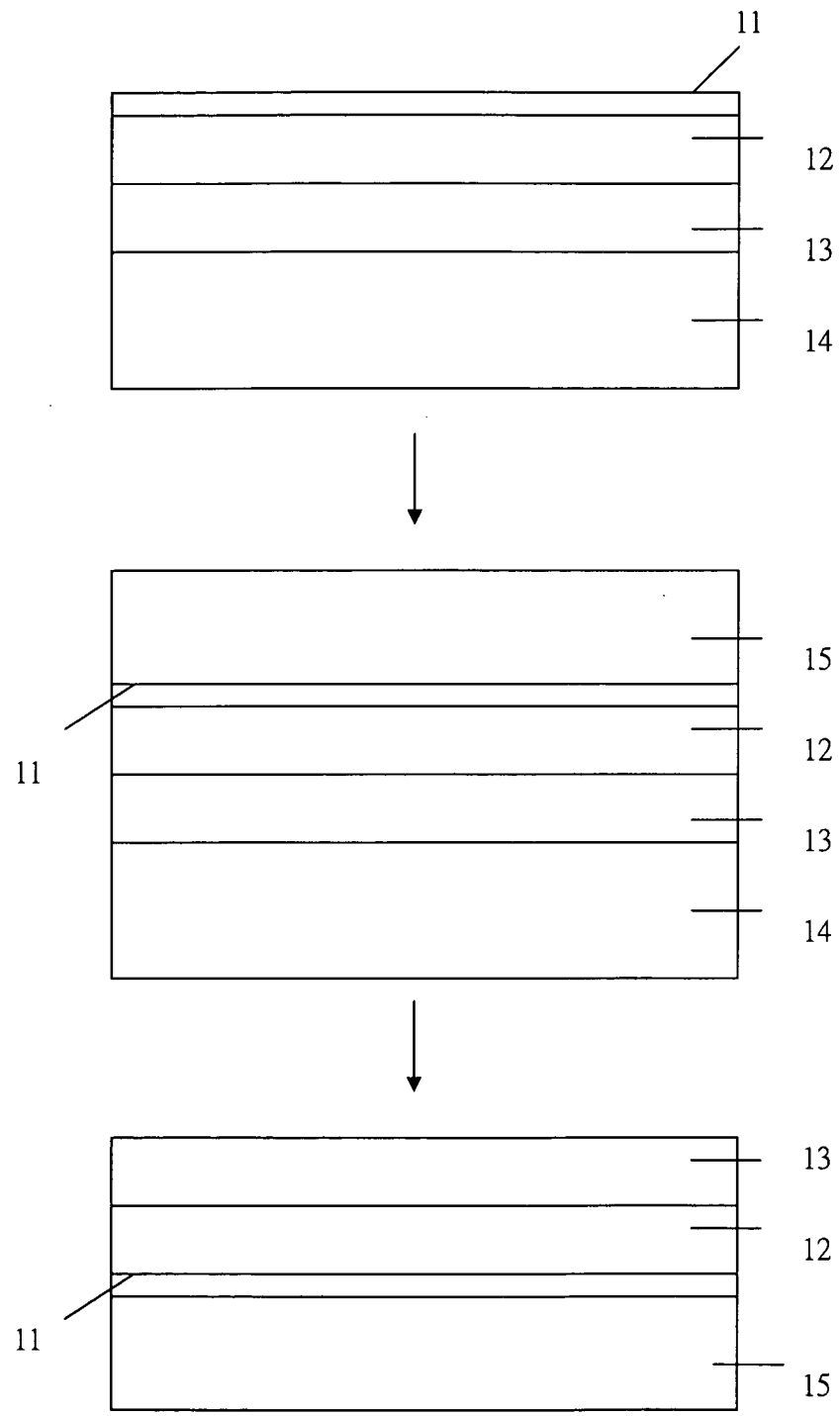
FIGS. 4A-4B show a flow chart of forming a stamp having a nanoscale structure in accordance with a third embodiment of the present invention.
Figure 4B:
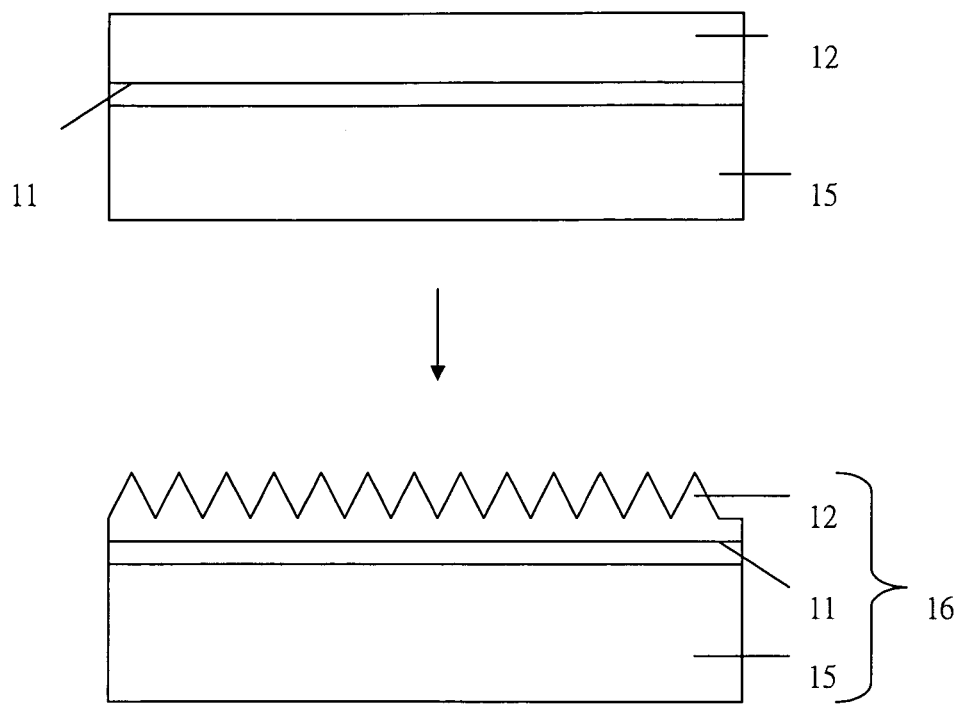

Embodiment 3:

Referring to FIGS. 4A and 4B, a connecting layer 13 such as un-doped gallium nitride is epitaxially grown on a temporary substrate 14 like aluminum oxide (sapphire) by metal-organic chemical vapor deposition (MOCVD) process. A stamp layer 12 such as un-doped gallium nitride or n-doped gallium nitride is formed on the connecting layer with a thickness of more than 5000 Å. A buffer layer 11 such as metal or dielectric material is formed by E-gun or plasma-enhanced chemical vapor deposition (PECVD) process. A silicon substrate 15 is adhered on the upper surface of the buffer layer. Next, the temporary substrate 14 is removed by a laser lift off process. The connecting layer formed by un-doped gallium nitride is removed by inductively coupled plasma reactive ion etching (ICP-RIE) process. Then the stamp layer formed by n-doped gallium nitride is etched by potassium hydroxide (KOH) for 3 minutes. The surface of the stamp layer can be patterned in serrated shape or triangle shape sized from 10 nm to 1000 nm and with a period in a range of 20 nm to 2000 nm to form a stamp having a nanoscale structure 16.

Figure 1B:
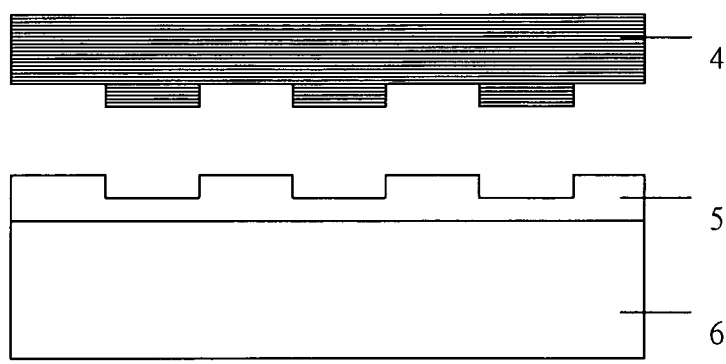
Figure 1C:
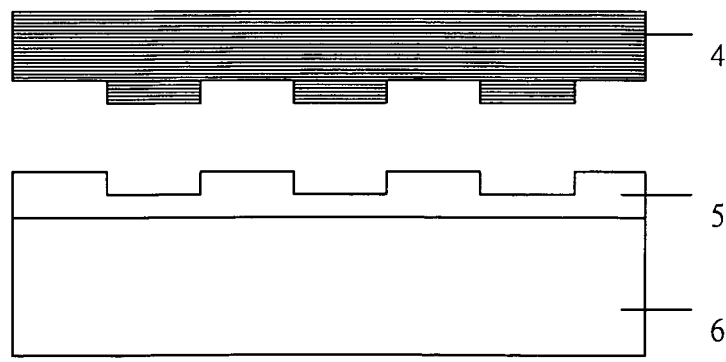
Figure 5:
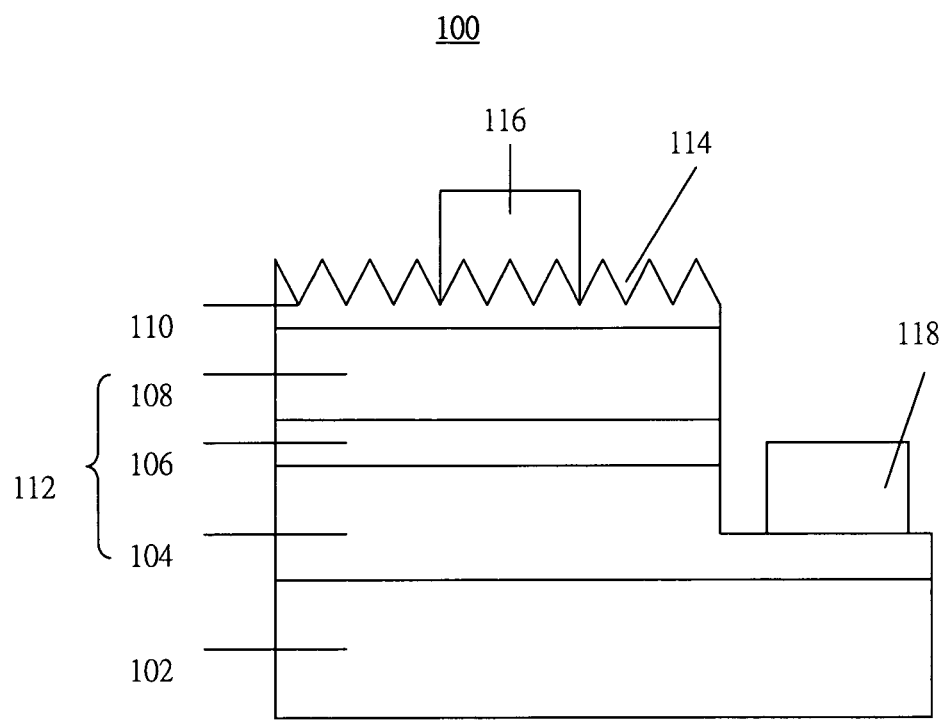
FIG. 5 shows a cross-sectional view of a light-emitting device using a stamp having a nanoscale structure in accordance with a fourth embodiment of the present invention.

The manufacturing method of stamp having a nanoscale structure of present invention can be applied to form light-emitting devices. It is used to roughen the surface of at least a material layer of the light-emitting devices. FIG. 5 shows a cross-sectional view of a light-emitting device manufactured in accordance with the fourth embodiment of the present invention. A light-emitting device 100 can be a light-emitting diode including a growth substrate 102, an epitaxial structure 112, a transparent conductive layer 110, a p-type electrode 116 and an n-type electrode 118. The epitaxial structure 112 includes at least an n-type semiconductor layer 104, a light-emitting layer 106 and a p-type semiconductor layer 108 stacked on the growth substrate 102. The material of the n-type semiconductor layer 104 and the p-type semiconductor layer 108 can be gallium nitride series materials; the light-emitting layer 106 can be a multi-quantum well structure, and the transparent conductive layer 110 can be indium tin oxides (ITO). The transparent conductive layer 110 and the epitaxial structure 112 are etched from the top to the bottom to expose a portion of the n-type semiconductor layer 104. The n-type electrode 118 is formed above the exposed portion of the n-type semiconductor layer 104. The p-type electrode 116 is formed above a portion of the transparent conductive layer 110. In this embodiment, the nanoscale pattern 114 are solely on the surface of the transparent conductive layer 110, wherein the nanoscale pattern 114 are imprinted by the stamp having nanoscale structure in accordance with the embodiments 1 to 3 with using the method of nano-imprint technology illustrated in FIGS. 1A-1C. By the nanoscale pattern 114 on the surface of the transparent conductive layer 110, the total reflection rate of the light extracted from the light-emitting layer 106 is substantially decreased, and the light efficiency of light-emitting device 100 is highly increased.

Figure 6:
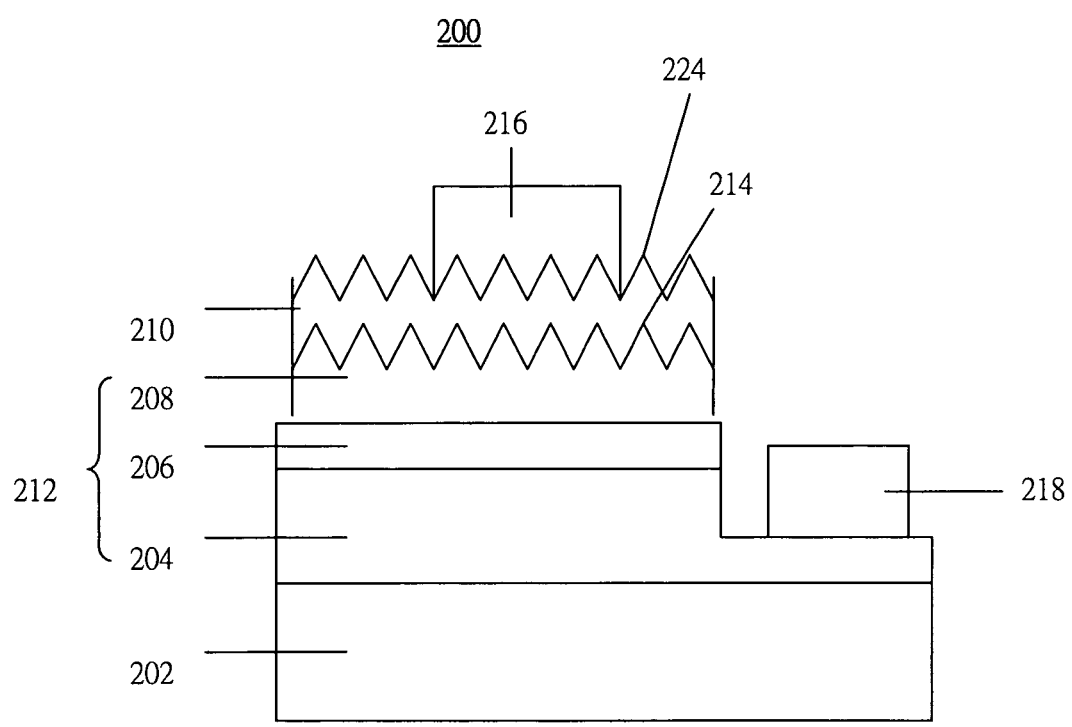
FIG. 6 shows a cross-sectional view of a light-emitting device using a stamp having a nanoscale structure in accordance with a fifth embodiment of the present invention.

FIG. 6 shows a cross-sectional view of a light-emitting device manufactured in accordance with the fifth embodiment present invention. A light-emitting device 200 can be a light-emitting diode, including a growth substrate 202, an epitaxial structure 212, a transparent conductive layer 210, a p-type electrode 216 and an n-type electrode 218. The epitaxial structure 212 including at least an n-type semiconductor layer 204, a light-emitting layer 206 and a p-type semiconductor layer 208 stacked on the growth substrate 202. The material of the n-type semiconductor layer 204 and the p-type semiconductor layer 208 can be gallium nitride series materials; the light-emitting layer 206 can be a multi-quantum well structure, and the transparent conductive layer 210 can be indium tin oxides (ITO). Then the transparent conductive layer 210 and the epitaxial structure 212 are etched from the top to the bottom to expose one portion of the n-type semiconductor layer 204. The n-type electrode 218 is formed above the exposed portion of the n-type semiconductor layer 204. The p-type electrode 216 is formed above one portion of transparent conductive layer 210. In this embodiment, the nanoscale pattern 214 are on the surface of the p-type semiconductor layer 208, and the nanoscale pattern 224 are on the surface of the transparent conductive layer 210, wherein the nanoscale patterns 214, 224 are imprinted by the stamp having nanoscale structure in accordance with the embodiments 1 to 3 with using the method of nano-imprint technology illustrated in FIGS. 1A-1C. By the nanoscale pattern 214 on the surface of the p-type semiconductor layer 208 and the nanoscale pattern 224 on the surface of the transparent conductive layer 210, the total reflection rate of the light extracted from the light-emitting layer 206 is substantially decreased, and the light efficiency of the light-emitting device 200 is highly increased.

Figure 7:
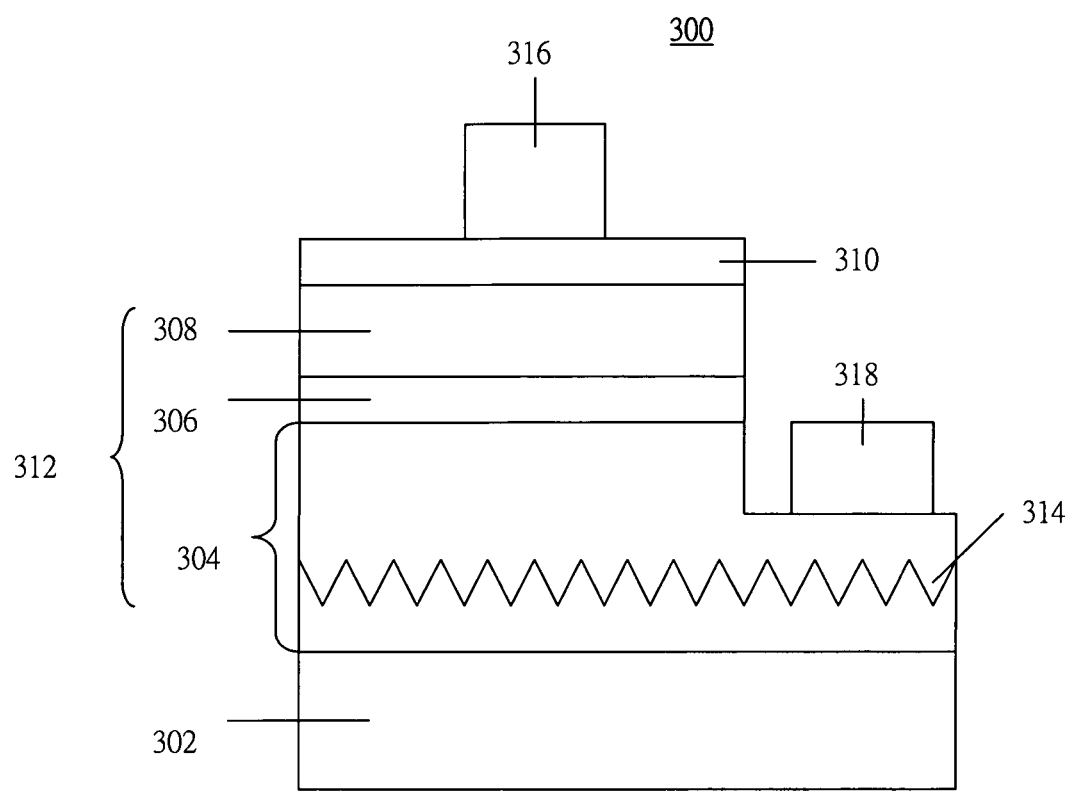
FIG. 7 shows a cross-sectional view of a light-emitting device using a stamp having a nanoscale structure in accordance with a sixth embodiment of the present invention.

FIG. 7 shows a cross-sectional view of a light-emitting device manufactured in accordance with the sixth embodiment of the present invention. A light-emitting device 300 can be a light-emitting diode, including a growth substrate 302, an epitaxial structure 312, a transparent conductive layer 310, a p-type electrode 316 and an n-type electrode 318. An epitaxial structure 312 including at least an n-type semiconductor layer 304, a light-emitting layer 306 and a p-type semiconductor layer 308 stacked on growth substrate 302. The material of the n-type semiconductor layer 304 and the p-type semiconductor layer 308 can be gallium nitride series materials; the light-emitting layer 306 can be a multi-quantum well structure, and the transparent conductive layer 310 can be indium tin oxides (ITO). Then the transparent conductive layer 310 and the epitaxial structure 312 are etched from the top to the bottom to expose one portion of the n-type semiconductor layer 304. The n-type electrode 318 is formed above the exposed portion of the n-type semiconductor layer 304. The p-type electrode 316 is formed above a portion of the transparent conductive layer 310. In this embodiment, the nanoscale pattern 314 are on the structure layer of the n-type semiconductor layer 304, wherein the nanoscale pattern 304 are imprinted by the stamp having nanoscale structure in accordance with the embodiments 1 to 3 with using the method of nano-imprint technology illustrated in FIGS. 1A-1C. By the nanoscale pattern 314 on the n-type semiconductor layer 304, the total reflection rate of the light extracted from the lighting-emitting layer 306 is substantially decreased, and the light efficiency of light-emitting device 300 is highly increased.

Figure 8:
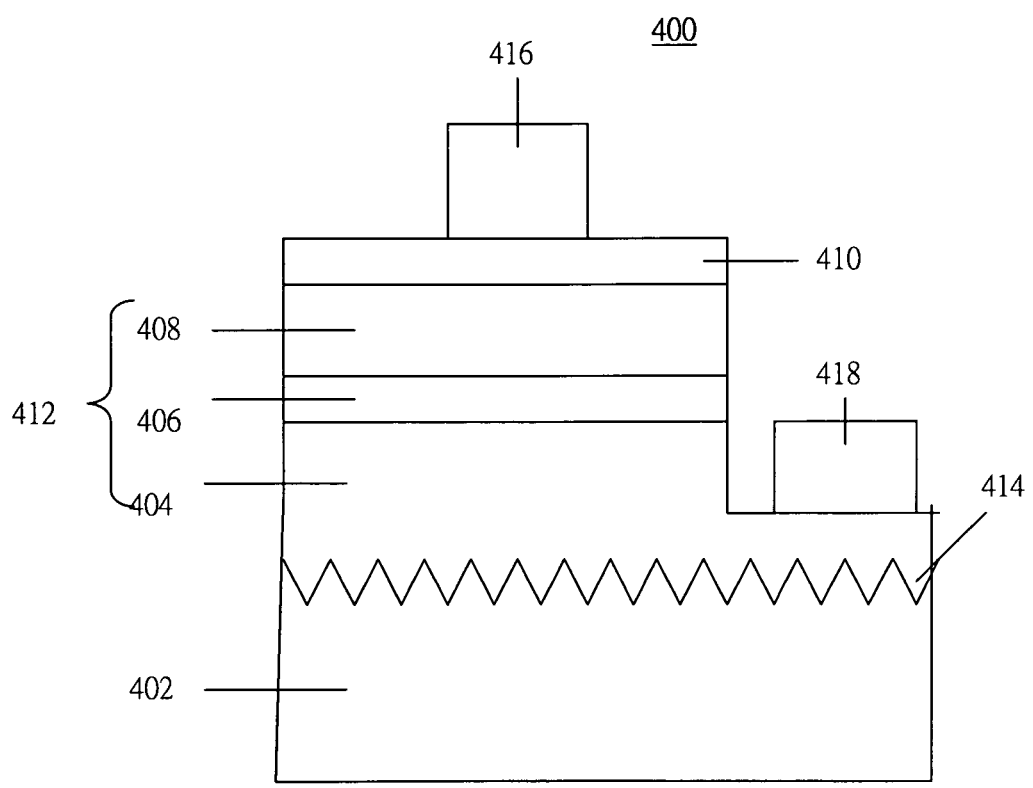
FIG. 8 shows a cross-sectional view of a light-emitting device using a stamp having a nanoscale structure in accordance with a seventh embodiment of the present invention.

FIG. 8 shows a cross-sectional view of a light-emitting device manufactured in accordance with the seventh embodiment of the present invention. A light-emitting device 400 can be a light-emitting diode, including a growth substrate 402, an epitaxial structure 412, a transparent conductive layer 410, a p-type electrode 416 and an n-type electrode 418. The epitaxial structure 412 including at least an n-type semiconductor layer 404, a light-emitting layer 406 and a p-type semiconductor layer 408 stacked on the growth substrate 402. The material of the n-type semiconductor layer 404 and the p-type semiconductor layer 408 can be gallium nitride series materials; the light-emitting layer 406 can be a multi-quantum well structure, and the transparent conductive layer 410 can be indium tin oxides (ITO). Then the transparent conductive layer 410 and the epitaxial structure 412 are etched from the top to the bottom to expose a portion of the n-type semiconductor layer 404. The n-type electrode 418 is formed above the exposed portion of the n-type semiconductor layer 404. The p-type electrode 416 is formed above a portion of the transparent conductive layer 410. In this embodiment, the nanoscale pattern 414 are on the surface of the growth substrate 402, wherein the nanoscale pattern 414 are imprinted by the stamp having nanoscale structure in accordance with the embodiments 1 to 3 with using the method of nano-imprint technology illustrated in FIGS. 1A-1C. By the nanoscale pattern 414 on the surface of the growth substrate 402, the total reflection rate of the light extracted from the light-emitting layer 406 is substantially decreased, and the light efficiency of light-emitting device 400 is highly increased.

What is claimed is:

1. A method of forming a nanoscale stamp structure comprising the steps of:
    forming a substrate;
    forming a buffer layer on the substrate; and
    forming a stamp layer directly on entire one surface of the buffer layer, wherein the surface of the stamp layer has a nanoscale structure and the material of the stamp layer is un-doped gallium nitride;
    and wherein the step of forming the nanoscale structure on the surface of the stamp layer on the buffer layer comprises etching the stamp layer by KOH for 3 minutes to form the surface of the stamp layer in a serrated shape or triangle shape ranging in size from 10 nm to 1,000 nm and with a period in range of 20 nm to 2,000 nm.

2. A method of forming a nanoscale stamp structure comprising the steps of:
    forming a substrate;
    forming a buffer layer on the substrate; and
    forming a stamp layer on the buffer layer, wherein the stamp layer is a single layer and the surface of the stamp layer has a nonascale structure and the material of the stamp layer is un-doped gallium nitride; and
    wherein the step of forming the nanoscale structure on the surface of the stamp layer on the buffer layer comprises etching the stamp layer by KOH for 3 minutes to form the surface of the stamp layer in a serrated shape or triangle shape ranging in size from 10 nm to 1,000 nm and with a period in range of 20 nm to 2,000 nm.

3. A method of forming a nanoscale stamp structure comprising the steps of:
    forming a substrate;
    forming an un-doped buffer layer on the substrate; and
    forming a stamp layer on the un-doped buffer layer, wherein the surface of the stamp layer has a nanoscale structure and the material of the stamp layer is un-doped gallium nitride; and
    wherein the step of forming the nanoscale structure on the surface of the stamp layer on the buffer layer comprises etching the stamp layer by KOH for 3 minutes to form the surface of the stamp layer in a serrated shape or triangle shape ranging in size from 10 nm to 1,000 nm and with a period in range of 20 nm to 2,000 nm.

* * * * *